United States Patent
Park et al.

(10) Patent No.: US 9,818,541 B2
(45) Date of Patent: Nov. 14, 2017

(54) MULTILAYER CERAMIC ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Heung Kil Park, Suwon-Si (KR); Kyoung Jin Jun, Suwon-Si (KR); Dae Hyung Yun, Suwon-Si (KR); Soon Ju Lee, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 157 days.

(21) Appl. No.: 14/630,448

(22) Filed: Feb. 24, 2015

(65) Prior Publication Data

US 2016/0086730 A1    Mar. 24, 2016

(30) Foreign Application Priority Data

Sep. 23, 2014    (KR) .................... 10-2014-0127168

(51) Int. Cl.
*H05K 1/18*    (2006.01)
*H01G 4/30*    (2006.01)
(Continued)

(52) U.S. Cl.
CPC ............... *H01G 4/30* (2013.01); *H01G 2/06* (2013.01); *H01G 4/232* (2013.01);
(Continued)

(58) Field of Classification Search
CPC ............ H01G 4/30; H01G 2/06; H01G 4/232; H01G 4/012; H05K 3/3426; H05K 1/181
(Continued)

(56) References Cited

U.S. PATENT DOCUMENTS

| | | | |
|---|---|---|---|
| 2004/0183147 A1* | 9/2004 | Togashi | ................ H01G 2/065 257/414 |
| 2010/0123995 A1* | 5/2010 | Otsuka | .................... H01G 2/06 361/308.1 |

FOREIGN PATENT DOCUMENTS

| | | |
|---|---|---|
| JP | 2001-185446 A | 7/2001 |
| JP | 2004-288847 A | 10/2004 |

(Continued)

OTHER PUBLICATIONS

Korean Office Action issued in Application No. 10-2014-0127168 dated Dec. 28, 2015, with English translation.

*Primary Examiner* — Eric Thomas
*Assistant Examiner* — Michael P McFadden
(74) *Attorney, Agent, or Firm* — McDermott Will & Emery LLP

(57) ABSTRACT

A multilayer ceramic electronic component and a board having the same are provided. The multilayer ceramic electronic component includes a multilayer ceramic capacitor including external electrodes including front portions and band portions extended from the front portions, terminal electrodes respectively surrounding the front portions and portions of lower surfaces of the band portions of the external electrodes and respectively having a 'ᄃ' shaped groove portion formed in lower portions thereof, and conductive adhesive layers connecting the external electrodes and the terminal electrodes to each other.

19 Claims, 3 Drawing Sheets

(51) Int. Cl.
   *H01G 2/06*     (2006.01)
   *H01G 4/232*    (2006.01)
   *H05K 3/34*     (2006.01)
   *H01G 4/012*    (2006.01)

(52) U.S. Cl.
   CPC ........... *H05K 3/3426* (2013.01); *H01G 4/012* (2013.01); *H05K 1/181* (2013.01); *H05K 2201/10015* (2013.01); *H05K 2201/10636* (2013.01); *H05K 2201/10651* (2013.01); *H05K 2201/10772* (2013.01); *H05K 2201/10818* (2013.01); *H05K 2201/10946* (2013.01); *H05K 2201/2045* (2013.01); *Y02P 70/611* (2015.11); *Y02P 70/613* (2015.11)

(58) Field of Classification Search
   USPC ..................................................... 361/321.1
   See application file for complete search history.

(56) References Cited

FOREIGN PATENT DOCUMENTS

| | | | |
|---|---|---|---|
| JP | 2010-123614 A | | 6/2010 |
| JP | 2012033655 A | * | 2/2012 |
| KR | 10-2005-00939878 A | | 9/2005 |

* cited by examiner

C-C'

MULTILAYER CERAMIC ELECTRONIC COMPONENT AND BOARD HAVING THE SAME

CROSS-REFERENCE TO RELATED APPLICATION

This application claims the priority and benefit of Korean Patent Application No. 10-2014-0127168 filed on Sep. 23, 2014, with the Korean Intellectual Property Office, the disclosure of which is incorporated herein by reference.

BACKGROUND

The present disclosure relates to a multilayer ceramic electronic component and a board having the same.

Electronic components using a ceramic material include capacitor, an inductor, a piezoelectric element, a varistor, a thermistor, and the like.

Among ceramic electronic components, a multilayer ceramic capacitor (MLCC) may be used in various electronic devices due to inherent advantages thereof, such as a small size, high capacitance and ease of mounting.

For example, such a multilayer ceramic capacitor may be used as a chip type condenser mounted on a board of various electronic products such as display devices, for example, liquid crystal displays (LCDs), plasma display panels (PDPs), and the like, computers, personal digital assistants (PDAs), and mobile phones, to serve to charge electrical charges therein or discharge electrical charges therefrom.

The multilayer ceramic capacitor may have a structure in which a plurality of internal electrodes having opposing polarities are alternately disposed between the dielectric layers.

In this case, since the dielectric layers have piezoelectric properties, when a direct current (DC) voltage or an alternating current (AC) voltage is applied to such a multilayer ceramic capacitor, a piezoelectric phenomenon may be generated between the internal electrodes, thereby generating periodic vibrations while expanding and contracting a volume of a ceramic body according to voltage frequency.

Such vibrations may be transferred to the board through external electrodes of the multilayer ceramic capacitor and solders connecting the external electrodes and the board to each other, such that the entire board may become a sound generating surface, whereby vibration sound, known as noise, may occur.

Vibration sound may correspond to an audio frequency range of 20 to 20,000 Hz causing listener discomfort. Such vibration sound causing listener discomfort as described above is known as acoustic noise.

In addition, recently, noiseless mode components have been provided in electronic devices, such that acoustic noise generated by the multilayer ceramic capacitors, as described above, may more significantly appear.

When the equipment is operated in a silent environment, users may perceive the acoustic noise as equipment failure.

In addition, in the devices having voice recognition circuits, acoustic noise may be overlapped with voice output, which may cause a problem in terms of deteriorated equipment quality.

SUMMARY

An aspect of the present disclosure may provide a multilayer ceramic electronic component (MLCC) having decreased acoustic noise and a board having the same.

According to an aspect of the present disclosure, a multilayer ceramic electronic component may include: a multilayer ceramic capacitor including external electrodes including front portions and band portions extended from the front portions; terminal electrodes respectively surrounding the front portions and portions of lower surfaces of the band portions of the external electrodes and respectively having 'c' shaped groove portions formed in lower portions of the terminal electrodes; and conductive adhesive layers connecting the external electrodes and the terminal electrodes to each other.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
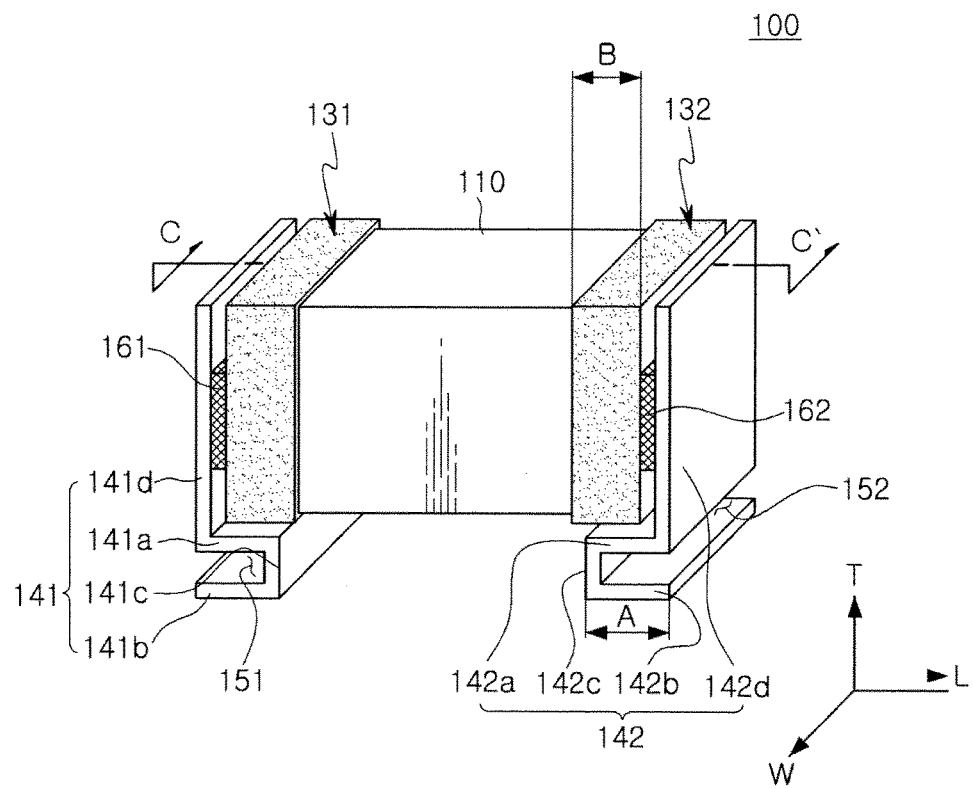
FIG. 1 is a perspective view schematically illustrating a multilayer ceramic electronic component according to an exemplary embodiment in the present disclosure.

Exemplary embodiments in the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Electronic Component

Figure 2:
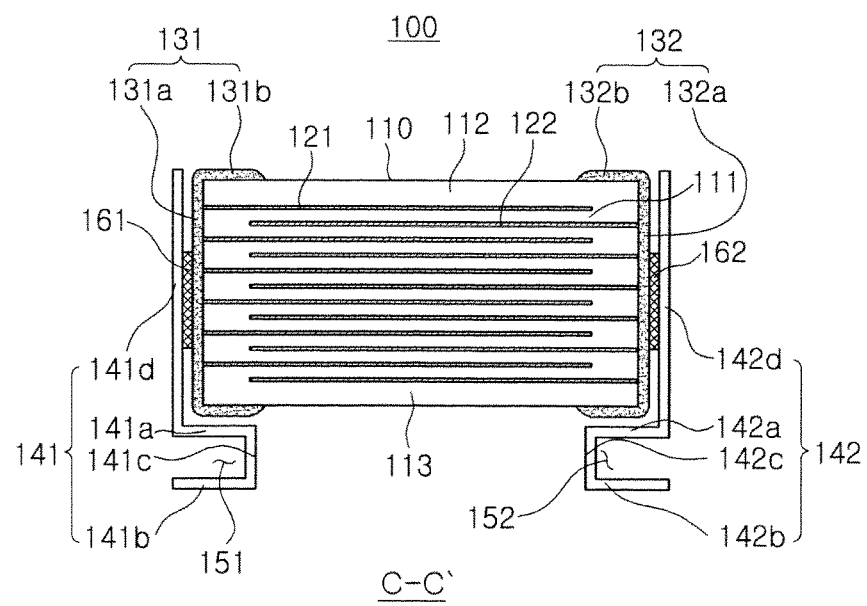
FIG. 2 is a cross-sectional view taken along line C-C' of FIG. 1.

FIG. 1 is a perspective view schematically illustrating a multilayer ceramic electronic component 100 according to an exemplary embodiment in the present disclosure, and FIG. 2 is a cross-sectional view taken along line C-C' of FIG. 1.

Referring to FIGS. 1 and 2, the multilayer ceramic electronic component 100 according to an exemplary embodiment in the present disclosure may include a multilayer ceramic capacitor; first and second terminal electrodes 141 and 142; and first and second conductive adhesive layers 161 and 162.

The multilayer ceramic capacitor may include a ceramic body 110; first and second internal electrodes 121 and 122; and first and second external electrodes 131 and 132.

The first and second conductive adhesive layers 161 and 162 may connect the first and second external electrodes 131 and 132 of the multilayer ceramic capacitor and the first and second terminal electrodes 141 and 142 to each other, respectively.

The ceramic body 110 may be formed by stacking a plurality of dielectric layers 111 in a thickness direction T and sintering the dielectric layers.

Here, the respective adjacent dielectric layers 111 of the ceramic body 110 may be integrated with each other so that boundaries therebetween may not be readily discernible without a scanning electron microscope (SEM).

In addition, the ceramic body 110 may have a hexahedral shape. However, exemplary embodiments in the present disclosure are not limited thereto.

In the exemplary embodiment of the present disclosure, for convenience of explanation, upper and lower surfaces of the ceramic body 110 refer to surfaces opposing each other in a thickness direction T in which the dielectric layers 111 of the ceramic body 110 are stacked, first and second end surfaces of the ceramic body 110 refer to surfaces connecting the upper and lower surfaces to each other and opposing each other in a length direction L, and third and fourth side surfaces of the ceramic body 110 refer to surfaces vertically intersecting the first and second end surfaces and opposing each other in a width direction W.

Meanwhile, the ceramic body 110 may have an upper cover layer 112 disposed on an uppermost internal electrode and a lower cover layer 113 disposed below a lowermost internal electrode, and the upper cover layer 112 may have a predetermined thickness.

Here, the upper and lower cover layers 112 and 113 may have the same composition as that of the dielectric layer 111 and may be formed by stacking at least one dielectric layer 111 not having the internal electrode thereon, on the uppermost internal electrode and below the lowermost internal electrode of the ceramic body 110, respectively.

The dielectric layer 111 may include a high-k ceramic material, for example, a barium titanate ($BaTiO_3$)-based ceramic powder, or the like. However, exemplary embodiments in the present disclosure are not limited thereto.

An example of the $BaTiO_3$-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, and the like, in which Ca, Zr, or the like, is partially dissolved in $BaTiO_3$. However, exemplary embodiments in the present disclosure are not limited thereto.

In addition, the dielectric layer 111 may further include at least one of a ceramic additive, an organic solvent, a plasticizer, a binder, and a dispersant.

As the ceramic additive, for example, a transition metal oxide or carbide, a rare earth element, magnesium (Mg), aluminum (Al), or the like, may be used.

The first and second internal electrodes 121 and 122 may be formed and stacked on ceramic sheets forming the dielectric layers 111, and then sintered, such that the first and second internal electrodes 121 and 122 are alternately disposed in the ceramic body 110 with each of the dielectric layers 111 interposed therebetween.

The first and second internal electrodes 121 and 122 may have different polarities and may be disposed to face each other in a direction in which the dielectric layers 111 are stacked and may be electrically insulated from each other by the dielectric layers 111 disposed therebetween.

One ends of the first and second internal electrodes 121 and 122 may be exposed through the first and second end surfaces of the ceramic body 110 in the length direction, respectively.

The ends of the first and second internal electrodes 121 and 122 alternately exposed through the first and second end surfaces of the ceramic body 110 in the length direction may be electrically connected to the first and second external electrodes 131 and 132, respectively, on the first and second end surfaces of the ceramic body 110 in the length direction.

Here, the first and second internal electrodes 121 and 122 may be formed of a conductive metal, for example, a material such as nickel (Ni), a nickel (Ni) alloy, or the like. However, exemplary embodiments in the present disclosure are not limited thereto.

According to the configuration as described above, when voltages having predetermined levels are applied to the first and second external electrodes 131 and 132, electric charges may be accumulated between the first and second internal electrodes 121 and 122 facing each other.

Here, capacitance of the multilayer ceramic capacitor may be in proportion to an area of a region in which the first and second internal electrodes 121 and 122 are overlapped with each other in a stacking direction of the dielectric layers 111.

The first and second external electrodes 131 and 132 may be disposed on both end surfaces of the ceramic body 110 in the length direction, respectively, and may include first and second front portions 131a and 132a, and first and second band portions 131b and 132b, respectively.

The first and second front portions 131a and 132a may cover the first and second end surfaces of the ceramic body 110 in the length direction, respectively, and may be connected and be electrically connected to exposed ends of the first and second internal electrodes 121 and 122, respectively.

The first and second band portions 131b and 132b may be extended from the first and second front portions 131a and 132a, respectively, so as to cover portions of a circumferential surface of the ceramic body 110.

Meanwhile, the first and second external electrodes 131 and 132 may have plating layers (not shown) formed thereon. As an example, the plating layers may include first and second nickel (Ni) plating layers disposed on the first and second external electrodes 131 and 132, respectively, and first and second tin (Sn) plating layers disposed on the first and second nickel plating layers, respectively.

A first terminal electrode 141 may include a first upper horizontal portion 141a, a first lower horizontal portion 141b, a first lower vertical portion 141c, and a first upper vertical portion 141d.

The first upper horizontal portion 141a may be disposed below a lower surface of the first band portion 131b of the first external electrode 131.

In addition, the first upper horizontal portion 141a may be disposed to be spaced apart from a lower surface of the first band portion 131b of the first external electrode 131 by a predetermined interval.

The first lower horizontal portion 141b may oppose the first upper horizontal portion 141a in the thickness direction, and may be disposed so as to be spaced apart from the first upper horizontal portion 141a by a predetermined interval.

The first lower vertical portion 141c may connect an inner edge of the first upper horizontal portion 141a and an inner edge of the first lower horizontal portion 141b to each other.

Here, the first lower vertical portion 141c may be positioned outwardly of an inner edge of the first band portion 131b in the length direction.

For example, in the exemplary embodiment of the present disclosure, a width portion A of the first lower horizontal portion 141b may not be positioned inwardly of a width portion B of the first band portion 131b in the length direction of the ceramic body 110.

For example, in a case in which, as a width of the first lower horizontal portion 141b is increased, the first lower vertical portion 141c is positioned inwardly of the inner edge of the portion B of the first band portion 131b toward the center of the capacitor in an L direction, maximum vibrations in the center of the multilayer ceramic capacitor may be easily transferred to a circuit board positioned downwardly thereof through the first lower vertical portion 141c of the first terminal electrode 141, such that acoustic noise may be increased.

The first upper vertical portion 141d may be extended upwardly from an outer edge of the first upper horizontal portion 141a.

In addition, the first upper vertical portion 141d may be disposed to be spaced apart from the first front portion 131a of the first external electrode 131.

According to a configuration of the first upper vertical portion 141d and the first upper horizontal portion 141a, the first terminal electrode 141 may surround the first front portion 131a and a portion of the lower surface of the first band portion 131b of the first external electrode 131.

In addition, according to a configuration of the first upper horizontal portion 141a, the first lower horizontal portion 141b, and the first lower vertical portion 141c, the first terminal electrode 141 may have a first groove portion 151 formed in a lower portion thereof and recessed inwardly in the ceramic body 110 in the length direction thereof.

For example, the first groove portion 151 may be provided as a '⊐' shaped groove portion.

Therefore, when the multilayer ceramic capacitor is mounted on the circuit board, solders may bond the first terminal electrode and the circuit board to each other, and in this case, the first lower vertical portion 141c may allow the multilayer ceramic capacitor to be spaced apart from the circuit board by a predetermined height and may allow the solders to be accommodated in the first groove portion 151, thereby preventing the solder from moving upwardly along the first terminal electrode 141 and directly contacting the first external electrode 131, such that acoustic noise may be reduced.

Here, since the first upper horizontal portion 141a is spaced apart from the lower surface of the first band portion 131b, the first groove portion 151 may also be spaced apart from the lower surface of the first band portion 131b.

The second terminal electrode 142 may include a second upper horizontal portion 142a, a second lower horizontal portion 142b, a second lower vertical portion 142c, and a second upper vertical portion 142d.

The second upper horizontal portion 142a may be disposed below a lower surface of the second band portion 132b of the second external electrode 132.

In addition, the second upper horizontal portion 142a may be disposed to be spaced apart from a lower surface of the second band portion 132b of the second external electrode 132 by a predetermined interval.

The second lower horizontal portion 142b may oppose the second upper horizontal portion 142a in the thickness direction, and may be disposed to be spaced apart from the second upper horizontal portion 142a by a predetermined interval.

The second lower vertical portion 142c may connect an inner edge of the second upper horizontal portion 142a and an inner edge of the second lower horizontal portion 142b to each other.

Here, the second lower vertical portion 142c may be positioned outwardly of an inner edge of the second band portion 132b in the length direction.

For example, in the exemplary embodiment of the present disclosure, a width portion A of the second lower horizontal portion 142b may not be positioned inwardly of an inner edge of a width portion B of the second band portion 132b in the length direction of the ceramic body 110.

For example, in a case in which, as a width of the second lower horizontal portion 142b is increased, an inner edge of the portion A is positioned inwardly of an inner edge of the portion B of the second band portion 132b in the length direction, maximum vibrations in the center of the multilayer ceramic capacitor may be easily transferred to the circuit board positioned downwardly thereof through the second lower vertical portion 142c of the second terminal electrode 142, such that acoustic noise may be increased.

The second upper vertical portion 142d may be extended upwardly from an outer edge of the second upper horizontal portion 142a.

In addition, the second upper vertical portion 142d may be disposed to be spaced apart from the second front portion 132b of the second external electrode 132.

According to the configuration of the second upper vertical portion 142d and the second upper horizontal portion 142a, the second terminal electrode 142 may surround the second front portion 132a and a portion of the lower surface of the second band portion 132b of the second external electrode 132.

In addition, according to a configuration of the second upper horizontal portion 142a, the second lower horizontal portion 142b, and the second lower vertical portion 142c, the second terminal electrode 142 may have a second groove portion 152 formed in a lower portion thereof and recessed inwardly in the ceramic body 110 in the length direction thereof.

For example, the second groove portion 152 may be provided as a '⊏' shaped groove portion.

Therefore, when the multilayer ceramic capacitor is mounted on the circuit board, solders may bond the second terminal electrode 142 and the circuit board to each other, and in this case, the second lower vertical portion 142c may allow the multilayer ceramic capacitor to be spaced apart from the circuit board by a predetermined height and may allow the solders to be accommodated in the second groove portion 152, thereby preventing the solder from moving upwardly along the second terminal electrode 142 and directly contacting the second external electrode 132, such that acoustic noise may be reduced.

Here, since the second upper horizontal portion 142a is spaced apart from the lower surface of the second band portion 132b, the second groove portion 152 may also be spaced apart from the lower surface of the second band portion 132b.

Meanwhile, the first and second terminal electrodes 141 and 142 may be formed using various conductive materials, for example, a conductive metal, a conductive resin such as conductive epoxy, or the like, a board coated with metal, or the like. Therefore, the materials forming the terminal electrodes according to exemplary embodiments in the present disclosure are not limited to specific materials.

In the exemplary embodiment of the present disclosure, the first and second conductive adhesive layers 161 and 162 may be interposed between the first and second front portions 131a and 132a of the first and second external electrodes 131 and 132, and the first and second upper vertical portion 141d and 142d of the first and second terminal electrodes 141 and 142, respectively, and may thus connect the first and second external electrodes 131 and 132 and the first and second terminal electrodes 141 and 142 to each other, respectively.

Here, the first and second conductive adhesive layers 161 and 162 may be formed of a high-melting point solder or a conductive paste. However, exemplary embodiments of the present disclosure are not limited thereto.

In addition, the first and second conductive adhesive layers 161 and 162 may respectively have an area smaller than that of the first and second front portions 131a and 132a of the first and second external electrodes 131 and 132.

Here, the first and second external electrodes 131 and 132 and the first and second terminal electrodes 141 and 142 may surface-contact each other by the first and second conductive adhesive layers 161 and 162, such that a problem in light of adhesion strength may not occur.

When the areas of the first and second conductive adhesive layers 161 and 162 are significantly decreased as described above, an amount of vibrations directly transferred to the terminal electrode from the multilayer ceramic capacitor may be reduced, and as a result, acoustic noise may be reduced.

According to the exemplary embodiment in the present disclosure, when voltages having different polarities are applied to the first and second external electrodes 131 and 132 disposed on the first and second end surfaces of the multilayer ceramic capacitor in the length direction in a state in which the multilayer ceramic capacitor is mounted on the circuit board, the ceramic body 110 may be expanded and contracted in the thickness direction due to an inverse piezoelectric effect of the dielectric layers 111, and the first and second end surfaces of the ceramic body 110 in the length direction thereof, having the first and second external electrodes 131 and 132 formed thereon, may be contracted and expanded in directions opposite to those of the expansion and the contraction of the ceramic body 110 in the thickness direction, due to a Poisson effect.

In this case, when the multilayer ceramic capacitor is mounted on the circuit board, and the like, the first and second terminal electrodes 141 and 142 may secure a predetermined interval between the multilayer ceramic capacitor and the circuit board so as to prevent direct contact between the first and second external electrodes 131 and 132 and the solders, and thus, a partial amount of vibrations transferred to the circuit board through the first and second external electrodes 131 and 132 of the multilayer ceramic capacitor may be absorbed by electricity of the first and second terminal electrodes 141 and 142, such that acoustic noise may be reduced.

Further, the first and second terminal electrodes 141 and 142 may absorb mechanical stress caused by warpage of the circuit board, and the like, thereby preventing stress from being transferred to the multilayer ceramic capacitor and preventing cracks in the multilayer ceramic capacitor.

Modified Example

Figure 3:
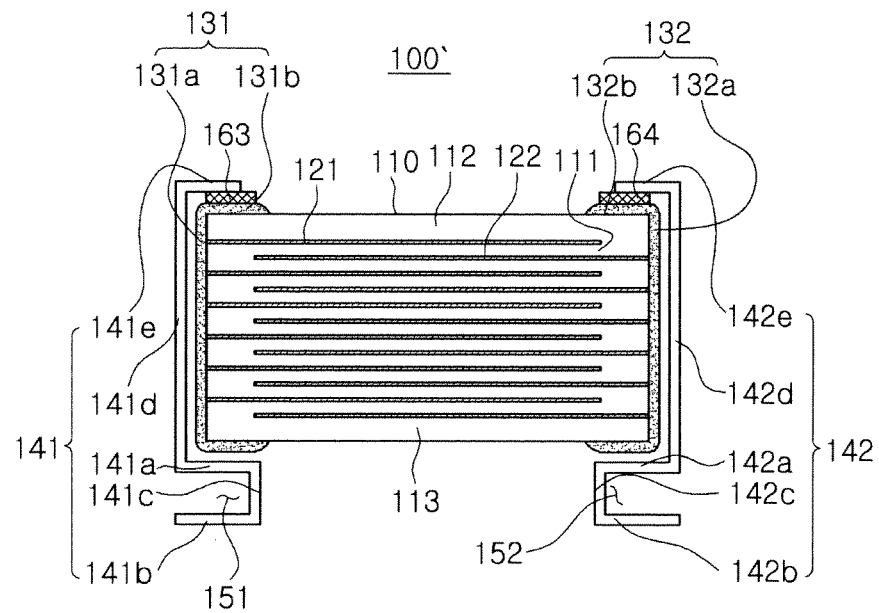
FIG. 3 is a cross-sectional view schematically illustrating a multilayer ceramic electronic component according to another exemplary embodiment in the present disclosure.

FIG. 3 is a cross-sectional view schematically illustrating a multilayer ceramic electronic component 100' according to another exemplary embodiment in the present disclosure.

Referring to FIG. 3, the first and second terminal electrodes 141 and 142 may further include first and second guide portions 141e and 142e extended from upper edges of the first and second upper vertical portions 141d and 142d to be disposed above upper surfaces of the first and second band portions 131b and 132b of the first and second external electrodes 131 and 132, respectively, such that the first and second guide portions 141e and 142e are located in positions higher than levels of the upper surfaces of the first and second band portions 131b and 132b, respectively.

In the exemplary embodiment of the present disclosure, the first and second conductive adhesive layers 163 and 164 may be interposed between upper surfaces of the first and second band portions 131b and 132b of the first and second external electrodes 131 and 132 and lower surfaces of the first and second guide portions 141e and 142e, and may electrically connect the first and second external electrodes 131 and 132 and the first and second terminal electrodes 141 and 142 to each other, respectively.

Here, the first and second conductive adhesive layers 163 and 164 may be formed of a high-melting point solder or a conductive paste. However, exemplary embodiments in the present disclosure are not limited thereto.

In addition, the first and second conductive adhesive layers 163 and 164 may respectively have an area smaller than those of upper surfaces of the first and second band portions 131b and 132b of the first and second external electrodes 131 and 132, respectively.

When the areas of the first and second conductive adhesive layers 163 and 164 are significantly decreased as described above, an amount of vibrations directly transferred to the terminal electrode from the multilayer ceramic capacitor may be reduced, and as a result, acoustic noise may be reduced.

Further, the first and second conductive adhesive layers 163 and 164 may also be interposed between the first and second front portions 131a and 132a of the first and second external electrodes 131 and 132 and the first and second upper vertical portions 141d and 142d of the first and second terminal electrodes 141 and 142, respectively, in a manner similar to that of the exemplary embodiment described above with reference to FIGS. 1 and 2.

When the first and second conductive adhesive layers 161 to 164 are all disposed on the first and second front portions 131a and 132a of the first and second external electrodes 131 and 132 and the upper surfaces of the first and second band portions 131b and 132b, respectively, adhesion strength between the first and second terminal electrodes 141 and 142 and the first and second external electrodes 131 and 132 may be improved.

Board Having Multilayer Ceramic Electronic Component

Figure 4:
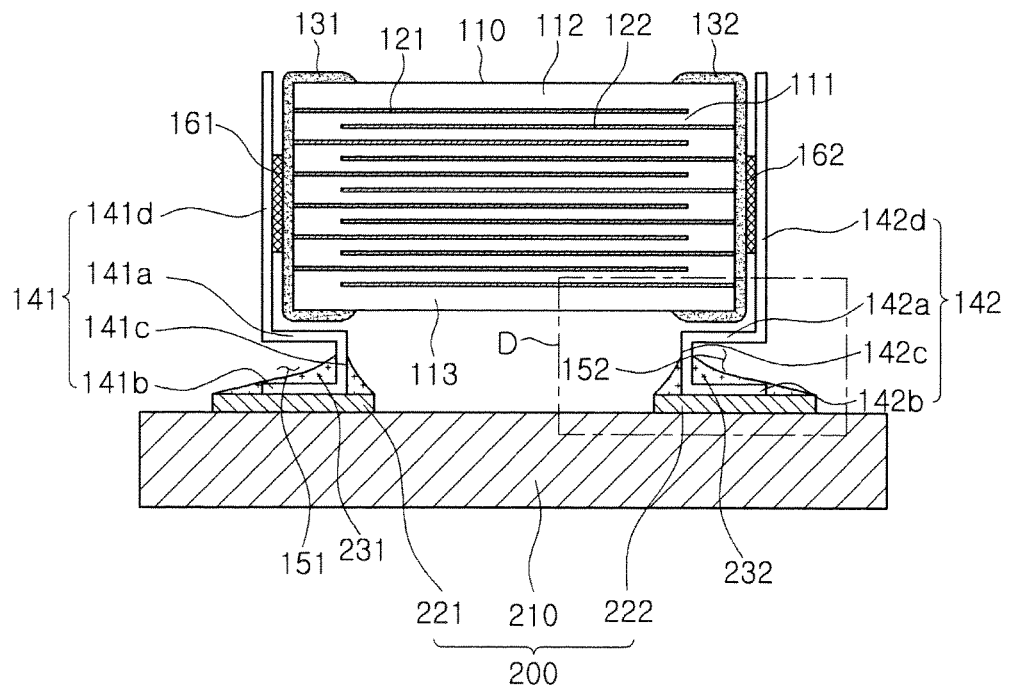
FIG. 4 is a cross-sectional view illustrating a form in which a multilayer ceramic electronic component according to an exemplary embodiment in the present disclosure is mounted on a circuit board.
Figure 5:
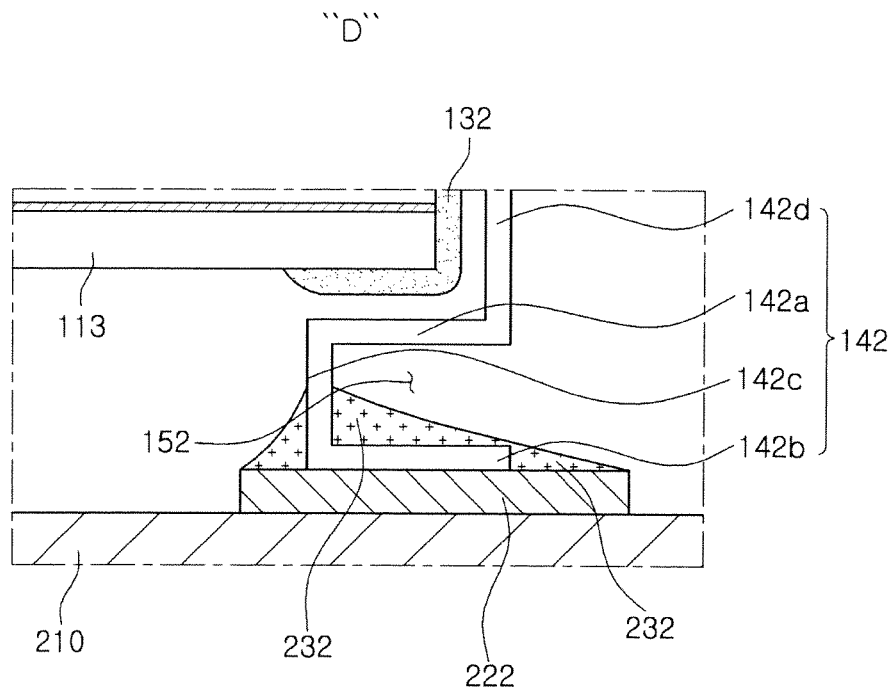
FIG. 5 is an enlarged cross-sectional view of part D of FIG. 4.

Referring to FIGS. 4 and 5, a board 200 having the multilayer ceramic electronic component according to an exemplary embodiment in the present disclosure may include a circuit board 210 on which the multilayer ceramic electronic component is horizontally mounted, and first and second electrode pads 221 and 222 disposed on the circuit board 210 to be spaced apart from each other.

Here, the multilayer ceramic electronic component may be electrically connected to the circuit board 210 by solders 231 and 232 in a state in which first and second lower body portions 141b and 142b of the first and second terminal electrodes 141 and 142 are positioned on the first and second electrode pads 221 and 222 so as to contact therewith, respectively.

When a voltage is applied in a state in which the multilayer ceramic electronic component is mounted on the circuit board 210 as described above, acoustic noise may occur.

Here, amounts of the solders 231 and 232 connecting the first and second external electrodes 131 and 132 of the multilayer ceramic electronic component and the first and second electrode pads 221 and 222 to each other, respectively, may be determined depending on the size of the first and second electrode pads 221 and 222, and a magnitude of acoustic noise may be controlled according to an amount of the solders 231 and 232.

Figure 6:
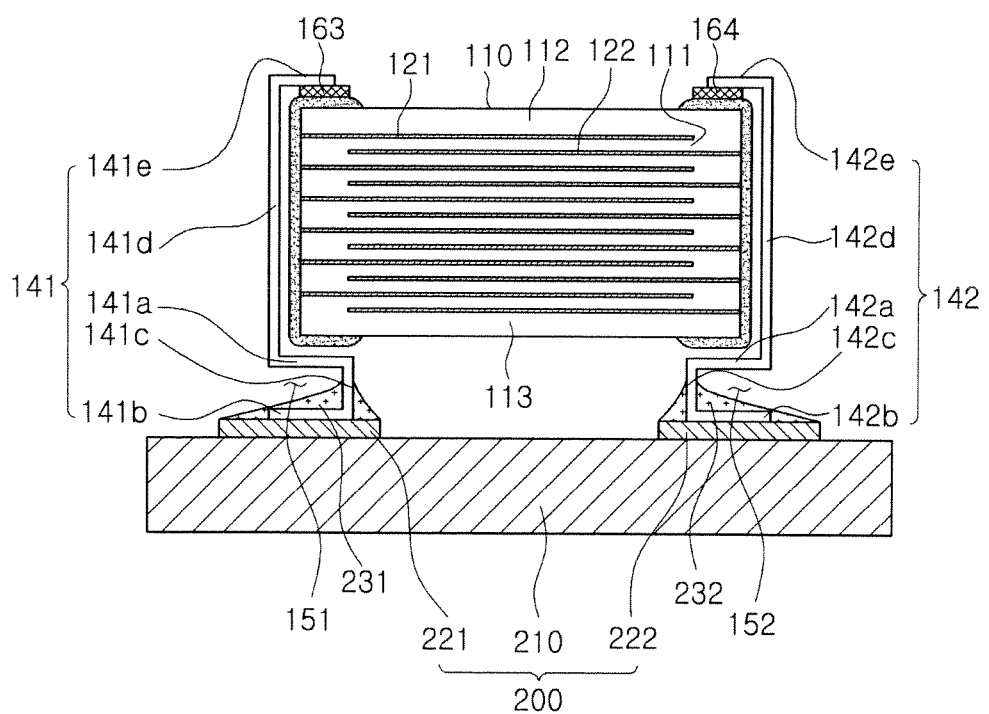
FIG. 6 is a cross-sectional view illustrating a form in which a multilayer ceramic electronic component according to another exemplary embodiment in the present disclosure is mounted on a circuit board.

Meanwhile, FIG. 6 illustrates a board having the multilayer ceramic electronic component according to another exemplary embodiment in the present disclosure. Here, since the board according to another exemplary embodiment in the present disclosure has the same structure as described above except for the shape of the terminal electrodes, a detailed description thereof will be omitted.

As set forth above, according to exemplary embodiments in the present disclosure, a predetermined interval between a multilayer ceramic capacitor and a circuit board may be secured and solders may be accommodated in a groove portion of a terminal electrode to thereby prevent direct contact between external electrodes and solders, and a partial amount of vibrations transferred by the external electrodes of the ceramic body may be absorbed by elasticity of the terminal electrode, such that acoustic noise may be reduced.

While exemplary embodiments in the present disclosure have been shown and described above, it will be apparent to those skilled in the art that modifications and variations could be made without departing from the scope of the present invention as defined by the appended claims.

What is claimed is:

1. A multilayer ceramic electronic component (MLCC) comprising: a multilayer ceramic capacitor including external electrodes including front portions covering end surfaces of a ceramic body in a length direction of the ceramic body and band portions extended from the front portions and covering portions of a circumferential surface of the ceramic body, respectively; terminal electrodes respectively surrounding the front portions and portions of lower surfaces of the band portions of the external electrodes and respectively having 'e' shaped groove portions formed in lower portions of the terminal electrodes; and conductive adhesive layers connecting the external electrodes and the terminal electrodes to each other, wherein the groove portion of the terminal electrode is recessed inwardly in the ceramic body in the length direction, wherein the groove portion of the terminal electrode is disposed directly below the lower surface of the band portion of the external electrode, and wherein the groove portion of the terminal electrode is disposed to be spaced apart from the lower surface of the band portion of the external electrode.

2. The multilayer ceramic electronic component of claim 1, wherein the conductive adhesive layer is disposed between the front portion of the external electrode and the terminal electrode.

3. The multilayer ceramic electronic component of claim 2, wherein the conductive adhesive layer has an area smaller than that of the front portion of the external electrode.

4. The multilayer ceramic electronic component of claim 1, wherein the terminal electrodes further include guide portions extended from upper edges of the terminal electrodes to be disposed above upper surfaces of the band portions of the external electrodes, in positions higher than levels of the upper surfaces of the band portions, respectively.

5. The multilayer ceramic electronic component of claim 4, wherein the conductive adhesive layer is disposed between the upper surface of the band portion of the external electrode and the guide portion.

6. The multilayer ceramic electronic component of claim 5, wherein the conductive adhesive layer has an area smaller than that of the upper surface of the band portion of the external electrode.

7. The multilayer ceramic electronic component of claim 4, wherein the conductive adhesive layer is disposed between the front portion of the external electrode and the terminal electrode, and between the upper surface of the band portion of the external electrode and the guide portion.

8. The multilayer ceramic electronic component of claim 7, wherein the conductive adhesive layer has an area smaller than that of the front portion of the external electrode or that of the upper surface of the band portion of the external electrode.

9. A multilayer ceramic electronic component comprising: a ceramic body including a plurality of dielectric layers stacked in the ceramic body in a thickness direction of the ceramic body; a plurality of first and second internal electrodes disposed in the ceramic body to be alternately exposed through both end surfaces of the ceramic body in a length direction of the ceramic body with each of the dielectric Dyers interposed between the first and second internal electrodes; first and second external electrodes including front portions covering both end surfaces of the ceramic body in the length direction, respectively, and connected to the first and second internal electrodes, and band portions extended from the front portions and covering portions of a circumferential surface of the ceramic body; first and second terminal electrodes respectively including an upper horizontal portion disposed below a lower surface of the band portion, a lower horizontal portion opposing the upper horizontal portion in the thickness direction, a lower vertical portion connecting one end of the upper horizontal portion and one end of the lower horizontal portion to each other and positioned outwardly of an edge of the band portion in the length direction, and an upper vertical portion extended from an other end of the upper horizontal portion to an upper side of the upper horizontal portion; and first and second conductive adhesive layers disposed between the first and second external electrodes and the first and second terminal electrodes, respectively; and connecting the first and second external electrodes and the first and second terminal electrodes to each other, respectively, wherein a groove portion of the terminal electrode is recessed inwardly in the ceramic body in the length direction, wherein the groove portion of the terminal electrode is disposed directly below the lower surface of the band portion of the external electrode, and wherein the upper horizontal portions of the first and second terminal electrodes are disposed to be spaced apart from the lower surfaces of the band portions of the first and second external electrodes.

10. The multilayer ceramic electronic component of claim 9, wherein the first and second conductive adhesive layers are disposed between the front portions of the first and second external electrodes and the upper vertical portions of the first and second terminal electrodes.

11. The multilayer ceramic electronic component of claim 10, wherein the first and second conductive adhesive layers have respective areas smaller than those of the front portions of the first and second external electrodes.

12. The multilayer ceramic electronic component of claim 9, wherein the first and second terminal electrodes further include guide portions extended from upper edges of the first and second terminal electrodes to be disposed above upper surfaces of the band portions of the first and second external electrodes, in positions higher than levels of the upper surfaces of the band portions, respectively.

13. The multilayer ceramic electronic component of claim 12, wherein the first and second conductive adhesive layers are disposed between the upper surfaces of the band portions of the first and second external electrodes and the guide portions, respectively.

14. The multilayer ceramic electronic component of claim 13, wherein the first and second conductive adhesive layers have respective areas smaller than those of the upper surfaces of the band portions of the first and second external electrodes.

15. The multilayer ceramic electronic component of claim 12, wherein the first and second conductive adhesive layers are disposed between the front portions of the first and second external electrodes and the first and second terminal electrodes, and between the upper surfaces of the band portions of the first and second external electrodes and the guide portions, respectively.

16. The multilayer ceramic electronic component of claim 15, wherein the first and second conductive adhesive layers have respective areas smaller than those of the front portions of the first and second external electrodes or those of the upper surfaces of the band portions of the first and second external electrodes.

17. The multilayer ceramic electronic component of claim 9, wherein the ceramic body further includes cover layers disposed on an uppermost internal electrode and disposed below a lowermost internal electrode, respectively.

18. A board having a multilayer ceramic electronic component, comprising:
a circuit board on which a plurality of electrode pads are disposed; and
the multilayer ceramic electronic component of claim 1, disposed on the circuit board.

19. A board having a multilayer ceramic electronic component, comprising:
a circuit board on which a plurality of electrode pads are disposed; and
the multilayer ceramic electronic component of claim 9, disposed on the circuit board.

* * * * *